United States Patent
Shiraishi

(10) Patent No.: US 11,781,215 B2
(45) Date of Patent: Oct. 10, 2023

(54) SUBSTRATE PROCESSING METHOD OF FORMING A PLATING FILM IN A RECESS

(71) Applicant: Tokyo Electron Limited, Tokyo (JP)

(72) Inventor: Masatoshi Shiraishi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/596,460

(22) PCT Filed: Jun. 8, 2020

(86) PCT No.: PCT/JP2020/022492
§ 371 (c)(1),
(2) Date: Dec. 10, 2021

(87) PCT Pub. No.: WO2020/255772
PCT Pub. Date: Dec. 24, 2020

(65) Prior Publication Data
US 2022/0275502 A1 Sep. 1, 2022

(30) Foreign Application Priority Data
Jun. 18, 2019 (JP) .................................. 2019-112782

(51) Int. Cl.
*C23C 16/40* (2006.01)
*C23C 16/02* (2006.01)

(52) U.S. Cl.
CPC .......... *C23C 16/0254* (2013.01); *C23C 16/40* (2013.01)

(58) Field of Classification Search
CPC .......................... C23C 16/0254; C23C 16/40
See application file for complete search history.

(56) References Cited

U.S. PATENT DOCUMENTS 7,456,501 B1 * 11/2008 Uzoh ................. H01L 21/76807
257/773
7,960,761 B2 * 6/2011 Chung .............. H01L 29/66621
257/E21.429
(Continued)

FOREIGN PATENT DOCUMENTS

EP 0316612 A2 * 5/1989 ............. H01L 21/90
GB 2574177 A * 1/2018 ........... H01L 21/288
(Continued)

OTHER PUBLICATIONS

Bezbaruah, Achintya, et al., "An innovative electro-corrosion recess creation technique for improved microelectrode fabrication". Water Research 36 (2002) 4428-4432.*
(Continued)

Primary Examiner — Bret P Chen
(74) Attorney, Agent, or Firm — Pearne & Gordon LLP

(57) ABSTRACT

A substrate processing method includes preparing a substrate, forming a plating inhibiting film and forming a plating film. In the preparing of the substrate, the substrate W which has a recess 101 formed on a front surface thereof and a seed layer 102 formed on the front surface and an inner surface of the recess is prepared. In the forming of the plating inhibiting film, the plating inhibiting film 103C is formed on an upper portion of the recess. In the forming of the plating film, the plating film 104 is formed in the recess by bringing the substrate into contact with a plating liquid after the forming of the plating inhibiting film, to thereby fill the recess with the plating film.

8 Claims, 6 Drawing Sheets

(56) References Cited

U.S. PATENT DOCUMENTS

| | | | | |
|---|---|---|---|---|
| 2002/0090814 A1* | 7/2002 | Inoue | ............... | H01L 21/76843 257/E21.585 |
| 2003/0069151 A1* | 4/2003 | Ye | ..................... | H01L 21/02052 134/28 |
| 2003/0070941 A1* | 4/2003 | Hirao | ..................... | G01N 27/42 205/775 |
| 2004/0226827 A1* | 11/2004 | Matsuda | ........... | H01L 21/76879 205/123 |
| 2006/0234499 A1* | 10/2006 | Kodera | ..................... | C25F 1/00 257/E21.175 |
| 2007/0227894 A1* | 10/2007 | Saijo | ........................ | C25D 5/02 205/183 |
| 2008/0142367 A1* | 6/2008 | Von Gutfeld | .......... | C25D 5/022 204/267 |
| 2010/0101700 A1* | 4/2010 | Liang | ....................... | B32B 27/16 156/73.6 |
| 2016/0190040 A1* | 6/2016 | Iwashita | ........... | H01L 21/76874 438/653 |

FOREIGN PATENT DOCUMENTS

| | | | | |
|---|---|---|---|---|
| JP | 54-126641 | * | 10/1979 | ............... C23C 1/02 |
| JP | 2000-235981 A | | 8/2000 | |
| JP | 2003-328180 A | | 11/2003 | |
| JP | 2005-333153 | * | 12/2005 | ........... H01L 21/288 |
| JP | 2005-333153 A | | 12/2005 | |
| JP | 2006-274369 | * | 10/2006 | ............... C25D 5/02 |
| JP | 2016-122800 A | | 7/2016 | |
| WO | 2018/230377 A1 | | 12/2018 | |
| WO | WO 2018/230377 A1 | * | 12/2018 | ........... H01L 21/306 |

OTHER PUBLICATIONS

Abadias, Gregory, et al., "Review Article: Stress in thin films and coatings: Current status, challenges, and prospects".: J. Vac. Sci. Technol. A 36, 020801 (2018) pp. 1-48.*

Esmaeli, Sajjad, et al., "Co-MOCVD processed seed layer for through silicon via copper metallization". Microelectronic Engineering, vol. 211, Apr. 15, 2019, pp. 55-59.*

Jordan, Matthew, et al., "Development of seed layer for electrodeposition of copper on carbon nanotube bundles". Journal of Vacuum Science and Technology B: Nanotechnology and Microelectronics 33(2), Mar./Apr. 2015, 021202-1 to 021202-8.*

Taghavikish, Mona, et al., "Emerging Corrosion Inhibitors for Interfacial Coating". Coatings, 2017, 7, 217, pp. 1-28.*

International Search Report for PCT/JP2020/022492 dated Aug. 25, 2020.

* cited by examiner

SUBSTRATE PROCESSING METHOD OF FORMING A PLATING FILM IN A RECESS

CROSS-REFERENCE TO RELATED APPLICATIONS

This Application is a U.S. national phase application under 35 U.S.C. § 371 of PCT Application No. PCT/JP2020/022492 filed on Jun. 8, 2020, which claims the benefit of Japanese Patent Application No. 2019-112782 filed on Jun. 18, 2019, the entire disclosures of which are incorporated herein by reference.

TECHNICAL FIELD

The various aspects and embodiments described herein pertain generally to a substrate processing method and a substrate processing apparatus.

BACKGROUND

Conventionally, in a semiconductor manufacturing process, a plating processing is used as a way to fill a metal such as copper in a recess such as a trench or a via.

In the plating processing, there is a risk that a defect such as a void or a seam may be formed in the recess because an opening of the recess is blocked by a plating film before the inside of the recess is filled with the plating film. In order to suppress such a defect, there has been proposed a technique in which an inhibitor for suppressing a precipitation rate of the metal at an upper portion of the recess or an accelerator for accelerating the precipitation rate of the metal at a bottom portion of the recess is added to a plating liquid.

Patent Document 1: Japanese Patent Laid-open Publication No. 2003-328180

SUMMARY

In an exemplary embodiment, a substrate processing method includes preparing a substrate, forming a plating inhibiting film and forming a plating film. In the preparing of the substrate, the substrate which has a recess formed on a front surface thereof and a seed layer formed on the front surface and an inner surface of the recess is prepared. In the forming of the plating inhibiting film, the plating inhibiting film is formed on an upper portion of the recess. In the forming of the plating film, the plating film is formed in the recess by bringing the substrate into contact with a plating liquid after the forming of the plating inhibiting film, to thereby fill the recess with the plating film.

DETAILED DESCRIPTION

Figure 1:
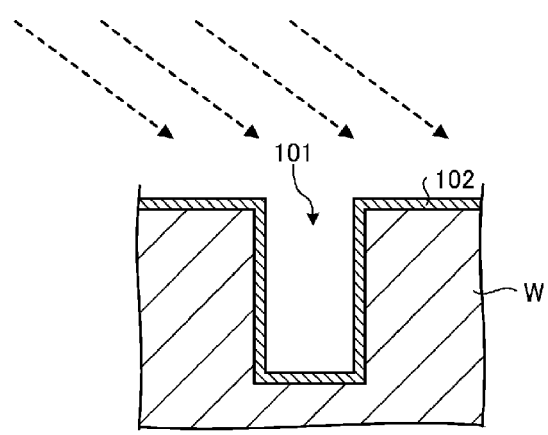
FIG. 1 is an explanatory diagram of a substrate processing according to an exemplary embodiment.

Hereinafter, embodiments for a substrate processing method and a substrate processing apparatus according to the present disclosure (hereinafter, referred to as "exemplary embodiments") will be described in detail with reference to the accompanying drawings. Further, it should be noted that the substrate processing method and the substrate processing apparatus according to the present disclosure are not limited by the exemplary embodiments. Furthermore, unless processing contents are contradictory, the various exemplary embodiments can be appropriately combined. In addition, in the various exemplary embodiments to be described below, same parts will be assigned same reference numerals, and redundant description will be omitted.

1. Outline of Substrate Processing

First, an outline of a substrate processing according to an exemplary embodiment will be described with reference to FIG. 1 to FIG. 4. FIG. 1 to FIG. 4 are explanatory diagrams for describing the substrate processing according to the exemplary embodiment.

In the substrate processing according to the exemplary embodiment, a plating film is formed on a semiconductor substrate (hereinafter, simply referred to as "substrate W") such as a silicon wafer or a compound semiconductor wafer by electroplating.

Specifically, as shown in FIG. 1, a plurality of recesses 101 (here, only one recess 101 is illustrated) is formed in a front surface (top surface) of the substrate W. The recess 101 is, for example, a trench or a via. Further, a seed layer 102 is formed on the front surface of the substrate W and an inner surface (a side surface and a bottom surface) of the recess 101. The seed layer 102 is made of, by way of example, a metal such as copper (Cu) or cobalt (Co), and is deposited on the substrate W by sputtering or the like.

In the substrate processing according to the exemplary embodiment, the recess 101 is filled with a plating film by electroplating.

In recent years, with the miniaturization of the recess such as the trench or the via with a high aspect ratio, it is getting difficult to bury the plating film in the recess. Specifically, since an opening of the recess is blocked by the plating film before the inside of the recess is filled with the plating film, there is a risk that a defect such as a void or a seam may be formed in the recess. For this reason, there has been proposed a technique in which an inhibitor for suppressing a precipitation rate of a metal at an upper portion of the recess or an accelerator for accelerating the precipitation rate of the metal at a bottom portion of the recess is added to a plating liquid to make the aforementioned defect less likely to occur.

However, in the method of adding an additive such as the inhibitor or the accelerator to the plating liquid, the additive introduced into the plating film increases resistance of the plating film, raising a likelihood that a function of the plating film as a wiring may be reduced.

In view of the foregoing, in the substrate processing according to the exemplary embodiment, the plating film is buried in the recess without adding the inhibitor or the accelerator to the plating liquid.

In the substrate processing according to the exemplary embodiment, light having straightness is radiated obliquely to the front surface of the substrate W, as shown in FIG. 1. By obliquely radiating the light having straightness, it is possible to suppress the light from reaching a deep portion (a lower portion and a bottom portion) of the recess 101. That is, the light can be radiated only to an upper portion (shallow portion) of the recess 101. Here, the term "upper portion of the recess 101" refers to a top surface of the recess 101, that is, the front surface of the substrate W and a side surface portion of the recess 101 near the top surface. Further, in some cases, only the top surface of the recess 101, that is, only the front surface of the substrate W may be referred to as "the upper portion of the recess 101."

Figure 2:
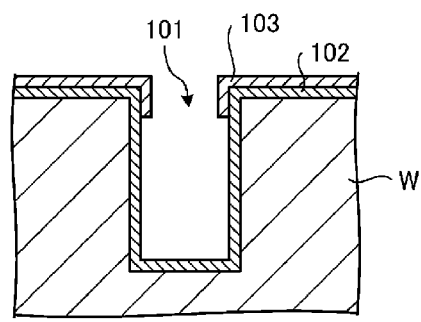
FIG. 2 is an explanatory diagram of the substrate processing according to the exemplary embodiment.

The light is, by way of non-limiting example, ultraviolet light having a wavelength equal to or less than 220 nm. In the substrate processing according to the exemplary embodiment, this ultraviolet light is radiated obliquely to the front surface of the substrate W in the air. Resultantly, oxygen existing near the upper portion of the recess 101 is turned into ozone by the ultraviolet light. This ozone oxidizes the seed layer 102 formed on the upper portion of the recess 101. As a result, an oxide film 103 as a plating inhibiting film is formed on the upper portion of the recess 101, as shown in FIG. 2.

As described above, in the substrate processing according to the exemplary embodiment, the oxide film 103 as the plating inhibiting film is first formed on the upper portion of the recess 101 (inhibiting film forming processing).

Further, although it is assumed in the present exemplary embodiment that the oxide film 103 is copper oxide, the oxide film 103 is not limited thereto. A metal oxide having insulating property, other than the copper oxide, may be used instead. Furthermore, the light having straightness may be laser light.

Figure 3:
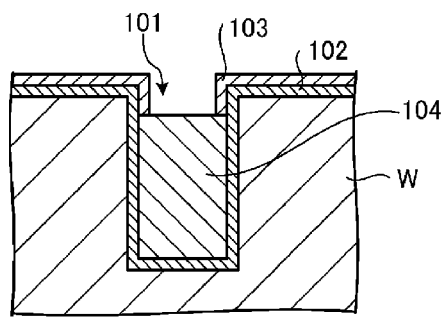
FIG. 3 is an explanatory diagram of the substrate processing according to the exemplary embodiment.
Figure 4:
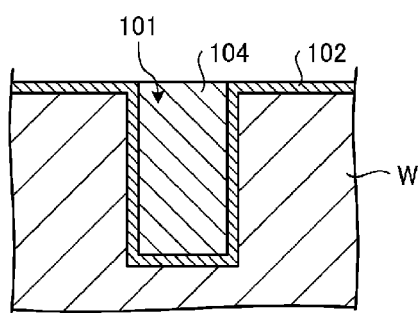
FIG. 4 is an explanatory diagram of the substrate processing according to the exemplary embodiment.

Next, in the substrate processing according to the exemplary embodiment, by bringing a plating liquid into contact with the substrate W, a plating film 104 is formed in the recess 101 to fill the recess 101 with the plating film 104, as shown in FIG. 3 and FIG. 4.

The plating liquid is a liquid capable of dissolving the oxide film 103 as the plating inhibiting film. For example, the plating liquid is a liquid containing copper sulfate and sulfuric acid, and is configured to dissolve the copper oxide as the oxide film 103.

In the initial stage of the plating processing, the seed layer 102 formed on the upper portion of the recess 101 does not come into contact with the plating liquid as it is covered with the oxide film 103. Thus, in the initial stage of the plating processing, the plating film 104 is not formed on the upper portion of the recess 101. Meanwhile, the seed layer 102 formed at portions (a middle portion, the lower portion, the bottom portion, etc.) other than the upper portion of the recess 101 is not covered with the oxide film 103. Therefore, the plating film 104 starts to be formed at the portions other than the upper portion of the recess 101 from the initial stage of the plating processing (see FIG. 3).

Thereafter, the oxide film 103 formed on the upper portion of the recess 101 is dissolved by the plating liquid. Accordingly, the seed layer 102 on the upper portion of the recess 101 is exposed and starts to come into contact with the plating liquid. That is, the plating film 104 starts to be formed on the upper portion of the recess 101 after the plating film 104 is formed on the lower portion and the bottom portion of the recess 101 (see FIG. 4).

As described above, in the plating processing of the substrate processing according to the exemplary embodiment, the recess 101 is filled with the plating film 104 by forming the plating film in the recess 101 while dissolving the oxide film 103 formed on the upper portion of the recess 101 with the plating liquid.

The formation of the plating film 104 on the upper portion of the recess 101 is begun at the moment when the oxide film 103 formed on the upper portion of the recess 101 is dissolved by the plating liquid. Therefore, the growth of the plating film 104 at the upper portion of the recess 101 is slower than the growth of the plating film 104 at the portions other than the upper portion of the recess 101. Accordingly, the opening of the recess 101 can be suppressed from being blocked with the plating film 104 before the inside of the recess 101 is filled with the plating film 104.

As described above, according to the substrate processing according to the exemplary embodiment, it is possible to suppress formation of a defect such as a void or a seam in the recess 101 without adding an additive such as an inhibitor or an accelerator. That is, the plating film 104 can be buried in the recess 101 successfully.

2. Configuration of Substrate Processing Apparatus

Figure 5:
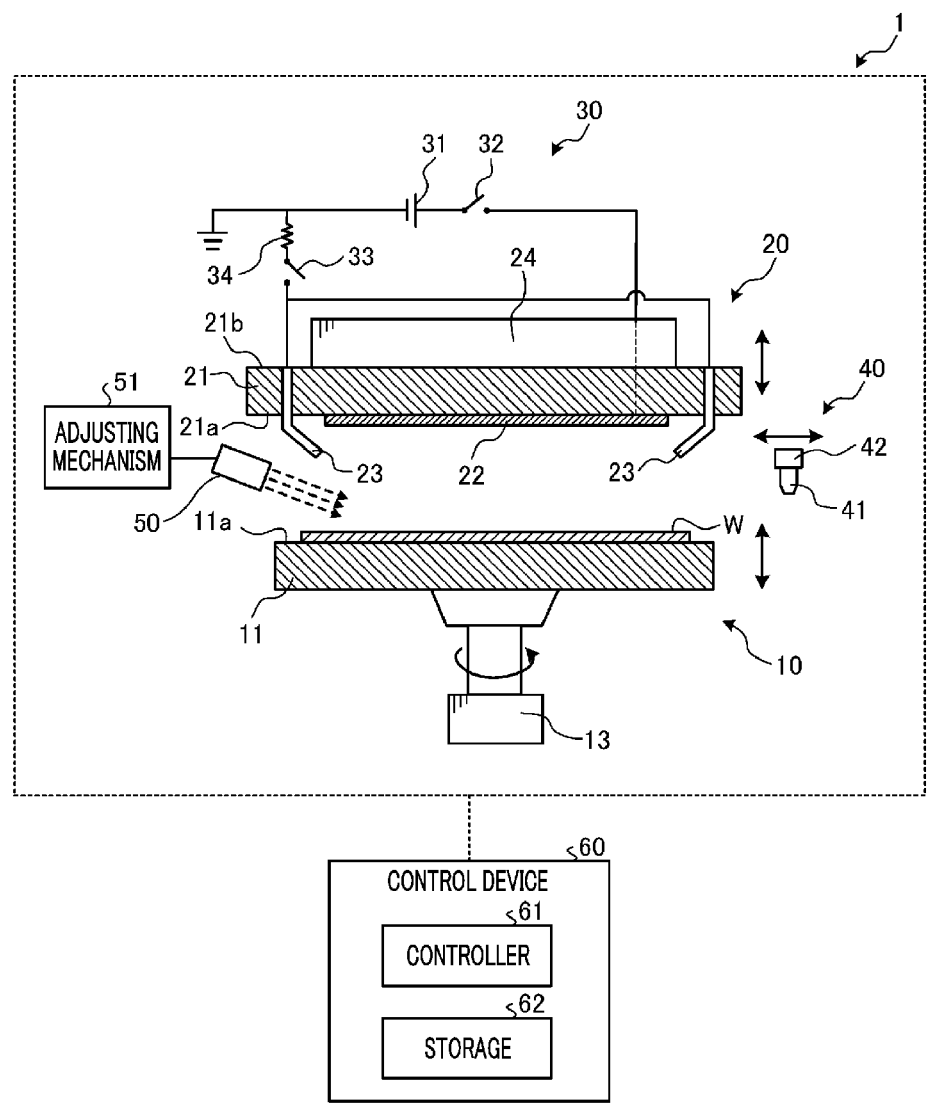
FIG. 5 is a diagram illustrating a configuration of a substrate processing apparatus according to the exemplary embodiment.

Now, a configuration of a substrate processing apparatus configured to perform the above-described substrate processing will be explained with reference to FIG. 5. FIG. 5 is a diagram illustrating the configuration of the substrate processing apparatus according to the exemplary embodiment.

A substrate processing apparatus 1 includes a substrate holder 10, an electrolytic processing device 20, a voltage applying device 30, a processing liquid supply mechanism 40, a UV radiation device 50, and a control device 60.

The substrate holder 10 holds the substrate W. The substrate holder 10 has a wafer chuck 11 and a driving mechanism 13.

The wafer chuck 11 is, for example, a spin chuck configured to hold and rotate the substrate W. The wafer chuck 11 is of a substantially disk shape, and has a top surface 11a extending in a horizontal direction and having a diameter larger than that of the substrate W when viewed from the top. A suction opening (not shown), for example, for suctioning the substrate W is provided on the top surface 11a, and the substrate W can be held on the top surface 11a of the wafer chuck 11 by suctioning through the suction opening.

The substrate holder 10 is further provided with the driving mechanism 13 including a motor or the like, so the wafer chuck 11 can be rotated at a predetermined speed. Further, the driving mechanism 13 is provided with an elevational driving unit (not shown) such as a cylinder, so the wafer chuck 11 can be moved in a vertical direction.

Above the substrate holder 10, the electrolytic processing device 20 is disposed to face the top surface 11a of the wafer chuck 11. The electrolytic processing device 20 includes a base 21, a direct electrode 22, a plurality of contact terminals 23, and a moving mechanism 24.

The base 21 is made of an insulating material. The base 21 is of a substantially disk shape, and has a bottom surface 21a having a diameter larger than that of the substrate W when viewed from the top and a top surface 21b provided on the opposite side of the bottom surface 21a.

The direct electrode 22 is made of a conductive material and is provided on the bottom surface 21a of the base 21. The direct electrode 22 is disposed to face the substrate W held by the substrate holder 10, substantially in parallel therewith. When an electroplating processing is performed, the direct electrode 22 comes into direct contact with the plating liquid accumulated on the substrate W.

The contact terminals 23 are protruded from the bottom surface 21a at a peripheral portion of the base 21. Each contact terminal 23 is made of a conductor having elasticity, and is curved toward a center of the bottom surface 21a.

The number of the contact terminals 23 provided on the base 21 may be two or more, for example, thirty two, and these contact terminals 23 are equi-spaced on a circle concentric with the base 21 when viewed from the top. Leading ends of all the contact terminals 23 are arranged so that an imaginary plane formed by these leading ends become substantially parallel to the front surface of the substrate W held by the substrate holder 10.

When the electroplating processing is performed, the contact terminals 23 come into contact with an outer periphery of the substrate W to apply a voltage to the substrate W. Further, the number and the shape of the contact terminals 23 are not limited to the example of the above-described exemplary embodiment.

The direct electrode 22 and the contact terminals 23 are connected to the voltage applying device 30 and are capable of applying a predetermined voltage to the plating liquid and the substrate W that are in contact with them.

The moving mechanism 24 is provided on the top surface 21b side of the base 21. The moving mechanism 24 has, for example, an elevational driving unit (not shown) such as a cylinder. The moving mechanism 24 is capable of moving the electrolytic processing device 20 in the vertical direction by using the elevational driving unit.

The voltage applying device 30 has a DC power supply 31, switches 32 and 33, and a load resistor 34, and is connected to the direct electrode 22 and the contact terminals 23 of the electrolytic processing device 20. Specifically, an anode side of the DC power supply 31 is connected to the direct electrode 22 via the switch 32, and a cathode side of the DC power supply 31 is connected to the plurality of contact terminals 23 via the switch 33 and the load resistor 34. The cathode side of the DC power supply 31 is grounded.

The voltage applying device 30 is capable of applying a pulse-shaped voltage to the direct electrode 22 and the contact terminals 23 by turning the switches 32 and 33 on and off at the same time.

The processing liquid supply mechanism 40 is disposed at a height position above the substrate holder 10 and below the electrolytic processing device 20. The processing liquid supply mechanism 40 has a nozzle 41 and a moving mechanism 42. The nozzle 41 supplies the plating liquid onto the substrate W. The nozzle 41 communicates with a non-illustrated plating liquid source that stores the plating liquid therein, and the plating liquid is supplied from this plating liquid source to the nozzle 41.

The moving mechanism 42 moves the nozzle 41 in the horizontal direction and the vertical direction. That is, the nozzle 41 is configured to advance to and retreat from the substrate holder 10.

The UV radiation device 50 obliquely radiates ultraviolet light having a wavelength of 220 nm or less to the top surface of the substrate W held by the wafer chuck 11, that is, the surface on which the recess 101 is formed.

The UV radiation device 50 is connected to an adjusting mechanism 51. The adjusting mechanism 51 is configured to adjust a radiation angle of the ultraviolet light from the UV radiation device 50 by rotating the UV radiation device 50 about a horizontal axis, for example.

As described above, by varying the radiation angle of the ultraviolet light using the adjusting mechanism 51, it is possible to adjust the depth to which the oxide film 103 is to be formed within the recess 101.

Further, the adjusting mechanism 51 adjusts a height position of the UV radiation device 50 by moving the UV radiation device 50 along the vertical axis, for example. By way of example, the adjusting mechanism 51 adjusts the height position of the UV radiation device 50 to be level with the height position of the top surface of the substrate W, and also adjusts the radiation angle of the ultraviolet light to 0°, that is, to be level with the top surface of the substrate W. Accordingly, the UV radiation device 50 can radiate the ultraviolet light only to the top surface of the substrate W. In this case, the substrate processing apparatus 1 can form the oxide film 103 only on the top surface of the substrate W.

The control device 60 is, for example, a computer, and includes a controller 61 and a storage 62. The storage 62 is implemented by, for example, a semiconductor memory device such as a RAM or a flash memory, or a storage device such as a hard disk or an optical disk. The storage 62 stores a program for controlling various kinds of processings performed in the substrate processing apparatus 1. The controller 61 includes various kinds of circuits and a microcomputer having a CPU (Central Processing Unit), a ROM (Read Only Memory), a RAM (Random Access Memory), an input/output ports, and the like. By reading and executing the program stored in the storage 62, the controller 61 controls an operation of the substrate processing apparatus 1.

The program is recorded in a computer-readable recording medium, and may be installed from this recording medium to the storage 62 of the control device 60. The computer-readable recording medium may be, by way of non-limiting example, a hard disk (HD), a flexible disk (FD), a compact disk (CD), a magnet optical disk (MO), a memory card, or the like.

The storage 62 may store therein angle information in which the radiation angle of the ultraviolet light by the UV radiation device 50 and the depth to which the oxide film 103 is formed in the recess 101 are matched. In this case, a user of the substrate processing apparatus 1 inputs a depth of formation of the oxide film 103 in the recess 101 by using a non-illustrated manipulation device belonging to the control device 60. Then, the control device 60 specifies a radiation angle of the ultraviolet light corresponding to the inputted depth of formation of the oxide film 103 by referring to the angle information, and controls the adjusting mechanism 51 such that the angle of the UV radiation device 50 becomes the specified radiation angle.

3. Specific Operation of Substrate Processing Apparatus

Figure 6:
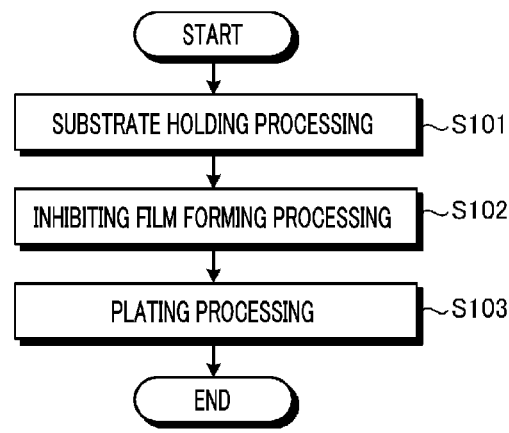
FIG. 6 is a flowchart illustrating a sequence of processings performed by the substrate processing apparatus according to the exemplary embodiment.

Now, a specific operation of the substrate processing apparatus 1 according to the exemplary embodiment will be described with reference to FIG. 6. FIG. 6 is a flowchart illustrating a sequence of processings performed by the substrate processing apparatus 1 according to the exemplary embodiment. The series of processings shown in FIG. 6 are performed under the control of the controller 61.

As shown in FIG. 6, in the substrate processing apparatus 1, a substrate holding processing is first performed (process S101).

In the substrate holding processing, the substrate processing apparatus 1 places the substrate W on the top surface 11a of the wafer chuck 11 by using a non-illustrated transfer mechanism. Then, the substrate processing apparatus 1 performs suctioning through the suction opening formed in the top surface 11a, for example, thus allowing the substrate W to be held by the substrate holder 10.

In addition, prior to this substrate holding processing, the recess 101 (see FIG. 1) and the seed layer 102 are formed on the top surface of the substrate W. Besides the seed layer 102, an insulating layer such as $SiO_2$, a barrier layer such as Ta or Ti, and the like may also be formed on the top surface of the substrate W, for example.

Next, in the substrate processing apparatus 1, an inhibiting film forming processing is performed (process S102). In the inhibiting film forming processing, the substrate processing apparatus 1 rotates the substrate W by using the substrate holder 10. Further, the substrate processing apparatus 1 radiates the ultraviolet light obliquely from the UV radiation device 50. Accordingly, the oxide film 103 as the plating inhibiting film is formed on the upper portion of the recess 101.

In the inhibiting film forming processing, by rotating the substrate W, the ultraviolet light radiated obliquely from the UV radiation device 50 can be radiated to the entire circumference of the side surface of the recess 101 on which the oxide film 103 is to be formed. That is, ozone can be fully generated near the side surface of the recess 101 on which the oxide film 103 is to be formed. Therefore, the oxide film 103 as the plating inhibiting film can be formed uniformly in a depth direction of the recess 101.

Further, although the exemplary embodiment has been described for the example where the UV radiation device 50 is embedded in the substrate processing apparatus 1, the UV radiation device 50 may be provided in an inhibiting film forming apparatus separately from the substrate processing apparatus 1. In this case, the inhibiting film forming apparatus may have a configuration in which a substrate holder, which is the same as the substrate holder 10 of the substrate processing apparatus 1, is provided in addition to the UV radiation device 50.

Next, in the substrate processing apparatus 1, a plating processing is performed (process S103). In the plating processing, the substrate processing apparatus 1 supplies the plating liquid from the nozzle 41 onto the substrate W, thus allowing the plating liquid to be accumulated on the substrate W. Then, the substrate processing apparatus 1 lowers the electrolytic processing device 20, thus allowing the leading ends of the contact terminals 23 to come into contact with the outer periphery of the substrate W and, also, allowing the direct electrode 22 to come into direct contact with the plating liquid. Then, the substrate processing apparatus 1 applies the voltage to the substrate W and the plating liquid so that the direct electrode 22 serves as the anode and the substrate W serves as the cathode, thus allowing an electric current to flow between the direct electrode 22 and the substrate W.

In the initial stage of this plating processing, the seed layer 102 formed on the upper portion of the recess 101 does not come into contact with the plating liquid because it is covered with the oxide film 103. Thus, in the initial stage of the plating processing, the plating film 104 is not formed on the upper portion of the recess 101. Meanwhile, the seed layer 102 formed at the portions (the middle portion, the lower portion, the bottom portion, etc.) other than the upper portion of the recess 101 is not covered with the oxide film 103. Therefore, the plating film 104 starts to be formed at the portions other than the upper portion of the recess 101 from the initial stage of the plating processing, that is, immediately after the voltage is applied to the substrate W and the plating liquid.

Thereafter, the oxide film 103 formed on the upper portion of the recess 101 is dissolved by the plating liquid. Accordingly, the seed layer 102 on the upper portion of the recess 101 is exposed and begins to come into contact with the plating liquid. As a result, the plating film 104 starts to be formed on the upper portion of the recess 101, and, finally, the entire recess 101 is filled with the plating film 104. If the plating processing is finished, the substrate processing upon the single sheet of substrate W is ended.

4. First Modification Example

Figure 7:
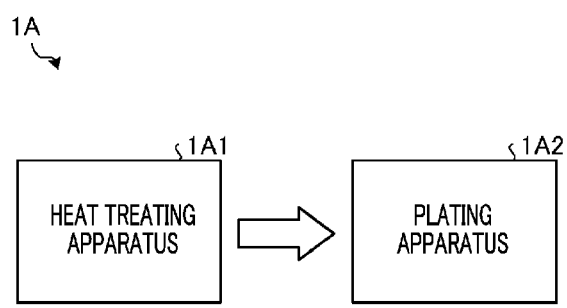
FIG. 7 is a diagram illustrating a configuration of a substrate processing apparatus according to a first modification example.

FIG. 7 is a diagram showing a configuration of a substrate processing apparatus according to a first modification example. As shown in FIG. 7, a substrate processing apparatus 1A according to the first modification example includes a heat treating apparatus 1A1 and a plating apparatus 1A2. The plating apparatus 1A2 has the same configuration as the above-described substrate processing apparatus 1, for example.

The heat treating apparatus 1A1 is configured to remove a natural oxide film formed on the front surface of the substrate W by heat-treating the substrate W in a reducing atmosphere of, for example, hydrogen or ammonia.

In the substrate processing apparatus 1A according to the first modification example, after the natural oxide film formed on the front surface of the substrate W is removed by using the heat treating apparatus 1A1, the processes S101 to S103 shown in FIG. 6 are performed by using the plating apparatus 1A2. In this way, by removing the natural oxide film formed on the substrate W before the inhibiting film forming processing (process S102), it is possible to form the oxide film 103 having a required thickness in the inhibiting film forming processing. Specifically, it can be suppressed that the thickness of the oxide film 103 after the inhibiting film forming processing becomes thicker than the required thickness.

In this example, although the natural oxide film removing processing is performed in the heat treating apparatus 1A1 separately from the plating apparatus 1A2, the natural oxide film removing processing may be performed in the plating apparatus 1A2. In this case, the plating apparatus 1A2 needs to be further equipped with, for example, a chamber capable of sealing an atmosphere inside, a gas supply configured to supply a reducing gas such as hydrogen or ammonia into the chamber, and a heating device embedded in, for example, the wafer chuck 11 to heat the substrate W.

In addition, the natural oxide film removing processing may also be accomplished by, for example, sputtering using an inert gas such as Ar gas. That is, the natural oxide film may be removed from the front surface of the substrate W by making the ionized inert gas collide with the front surface of the substrate W at a high speed.

5. Second Modification Example

Figure 8:
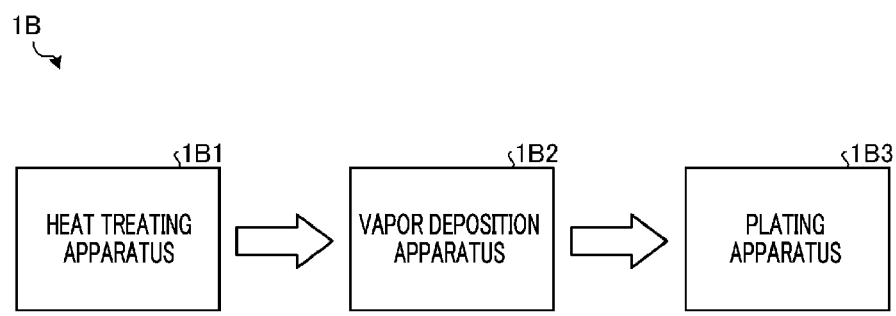
FIG. 8 is a diagram illustrating a configuration of a substrate processing apparatus according to a second modification example.

Next, a configuration of a substrate processing apparatus according to a second modification example will be explained with reference to FIG. 8. FIG. 8 is an explanatory diagram of a substrate processing according to the second modification example.

As depicted in FIG. 8, a substrate processing apparatus 1B according to the second modification example includes a heat treating apparatus 1B1, a vapor deposition apparatus 1B2, and a plating apparatus 1B3.

The heat treating apparatus 1B1 is configured to remove the natural oxide film of the substrate W by heat-treating the substrate W in a certain atmosphere, the same as the heat treating apparatus 1A1 of the first modification example. The plating apparatus 1B3 has, for example, a configuration prepared by omitting the UV radiation device 50 and the adjusting mechanism 51 from the above-mentioned substrate processing apparatus 1.

The vapor deposition apparatus 1B2 is a sputtering apparatus configured to vapor-deposit the oxide film 103 on the substrate W by using a sputtering method, for example. The vapor deposition apparatus 1B2 allows an ionized inert gas to collide with a target, which is a film forming material, in a decompressed atmosphere, causing atoms of the film forming material to be released from the target to adhere to and be deposited on the front surface of the substrate W. This vapor deposition apparatus 1B2 emits the atoms of the film forming material obliquely with respect to the front surface of the substrate W. Accordingly, the adhesion and the deposition of the oxide film 103 on the lower portion and the bottom portion of the recess 101 can be suppressed. That is, the oxide film 103 can be formed only on the upper portion of the recess 101.

In addition, the vapor deposition apparatus 1B2 may be a CVD apparatus configured to vapor-deposit the oxide film 103 on the substrate W by using a CVD (Chemical Vapor Deposition) method. In this case, the vapor deposition apparatus 1B2 obliquely radiates light or plasma having straightness to the front surface of the substrate W while supplying a source gas containing the film forming material in the air or in a decompressed atmosphere. Since the light or the plasma does not reach the lower portion and the bottom portion of the recess 101, it is possible to suppress the adhesion and the deposition of the oxide film 103 at the portions other than the upper portion of the recess 101. That is, the oxide film 103 can be formed only on the upper portion of the recess 101.

In the substrate processing apparatus 1B according to the second modification example, the natural oxide film removing processing is first performed by using the heat treating apparatus 1B1, and, then, the inhibiting film forming processing is performed by using the vapor deposition apparatus 1B2. Thereafter, the substrate processing apparatus 1B performs the plating processing by using the plating apparatus 1B3.

As described above, the inhibiting film forming processing may be performed by using the vapor deposition method. By using the vapor deposition method of depositing the oxide film 103 on the seed layer 102, the oxide film 103 can be formed on the seed layer 102 without reducing the thickness of the seed layer 102.

6. Third Modification Example

Figure 9:
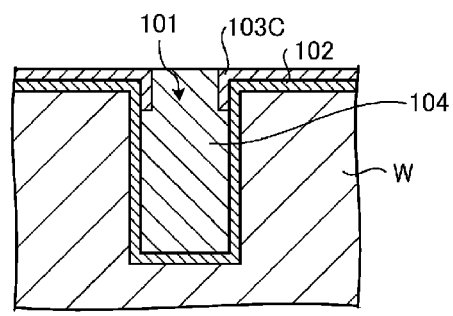
FIG. 9 is an explanatory diagram of a substrate processing according to a third modification example.
Figure 10:
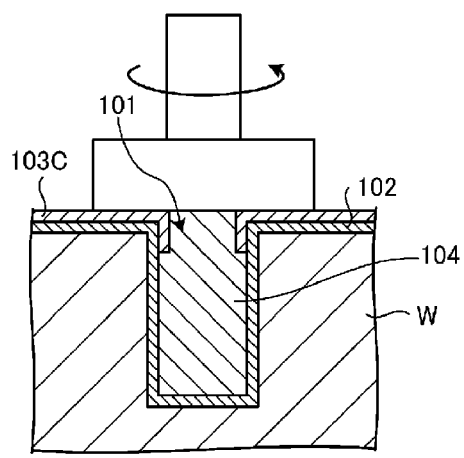
FIG. 10 is an explanatory diagram of the substrate processing according to the third modification example.
Figure 11:
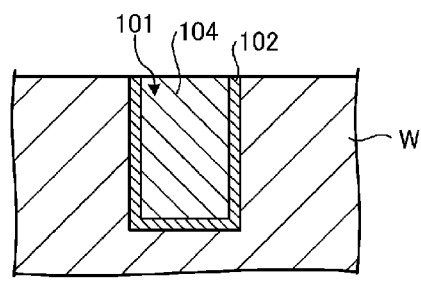
FIG. 11 is an explanatory diagram of the substrate processing according to the third modification example.

Now, a substrate processing according to a third modification example will be described with reference to FIG. 9 to FIG. 11. FIG. 9 to FIG. 11 are explanatory diagrams for describing the substrate processing according to the third modification example.

Unlike the above-described oxide film 103, a plating inhibiting film 103C shown in FIG. 9 is not dissolved in the plating liquid. As such a plating inhibiting film 103C, a resin film such as PTFE (polytetrafluoroethylene) or PFA (tetrafluoroethylene/perfluoroalkyl vinyl ether copolymer) is used, for example. Alternatively, a silicon-based film such as a silicon oxide film or a silicon nitride film may be used as the plating inhibiting film 103C.

In the substrate processing according to the third modification example, after the recess 101 is filled with the plating film 104 by the plating processing, a processing of removing the plating inhibiting film 103C remaining on the substrate W is performed.

For example, as shown in FIG. 10, in the substrate processing according to the third modification example, a polishing processing is performed on the front surface of the substrate W by CMP (Chemical Mechanical Polishing). In this polishing processing, the substrate W is polished until the plating inhibiting film 103C is removed from the substrate W (see FIG. 11).

In this way, the plating inhibiting film 103C may be removed from the substrate W by the mechanical polishing after the plating processing.

As described above, the substrate processing method according to the exemplary embodiment includes a preparation process, an inhibiting film forming process (as an example, the inhibiting film forming processing), and a plating process (as an example, the plating processing). In the preparation process, a substrate (as an example, the substrate W) having a recess (as an example, the recess 101) formed on a front surface thereof and having a seed layer (as an example, the seed layer 102) formed on the front surface and an inner surface of the recess is prepared. In the inhibiting film forming process, a plating inhibiting film (as an example, the oxide film 103 or the plating inhibiting film 103C) is formed on an upper portion of the recess. In the plating process, by bringing a plating liquid into contact with the substrate after the inhibiting film forming process, a plating film is formed in the recess, so that the recess is filled with the plating film (as an example, the plating film 104).

Since the plating process is performed in the state that the plating inhibiting film is formed on the upper portion of the recess, the opening of the recess can be suppressed from being blocked by the plating film before the inside of the recess is filled with the plating film. Thus, it is possible to fill the recess with the plating film successfully without needing to add the additive such as an inhibitor or an accelerator.

In the inhibiting film forming process, by radiating the light having straightness obliquely to the front surface of the substrate, the plating inhibiting film may be formed on the upper portion of the recess.

Specifically, in the inhibiting film forming process, by oxidizing the seed layer formed on the upper portion of the recess while generating ozone near the upper portion of the recess by radiating ultraviolet light obliquely to the front surface of the substrate, an oxide film is formed on the upper portion of the recess.

By obliquely radiating the light having straightness, it is possible to suppress the light from reaching the deep portion of the recess. That is, the light is radiated only to the upper portion of the recess 101, so that the oxide film can be formed only on the upper portion of the recess 101.

In the inhibiting film forming process, the oxide film may be deposited on the seed layer formed on the upper portion of the recess by allowing ion particles to collide with the film forming material to release atoms of a film forming material obliquely to the front surface of the substrate by a sputtering method.

In addition, in the inhibiting film forming process, the oxide film may be deposited on the seed layer formed on the upper portion of the recess by radiating light or plasma having straightness obliquely to the front surface of the substrate in an atmosphere supplied with a source gas containing a film forming material through a CVD (Chemical Vapor Deposition) method.

By using this vapor deposition method, such as the CVD or the sputtering, in which the oxide film is deposited on the seed layer, it is possible to form the oxide film on the seed layer without reducing the thickness of the seed layer.

In the plating process, the recess may be filled with the plating film by forming the plating film in the recess while dissolving the oxide film with the plating liquid. In the plating process, since the plating film starts to be formed on the upper portion of the recess later than that formed on the deep portion of the recess, it is possible to suppress the opening of the recess from being blocked by the plating film before the inside of the recess is filled with the plating film. Furthermore, since the processing of filling the recess with the plating film and the process of removing the oxide film can be performed in parallel, the efficiency of the substrate processing can be improved.

The substrate processing method according to the exemplary embodiment may further include a polishing process (as an example, the polishing processing). In the polishing process, the upper portion of the recess is removed by mechanical polishing together with the plating inhibiting film after the plating process. Thus, the plating inhibiting film which is no more necessary can be removed from the substrate.

The substrate processing method according to the exemplary embodiment may further include a natural oxide film removing process (as an example, the natural oxide film removing processing). In the natural oxide film removing process, a natural oxide film formed on the substrate is removed after the preparation process and before the inhibiting film forming process. Therefore, in the inhibiting film forming process, it is possible to form the plating inhibiting film having a required thickness.

Additionally, a substrate processing apparatus (as an example, the substrate processing apparatus 1, the substrate processing apparatus 1A, or the substrate processing apparatus 1B) according to the exemplary embodiment includes an inhibiting film forming device (as an example, the substrate holder 10, the UV radiation device 50, and the adjusting mechanism 51), and a plating liquid supply (as an example, the processing liquid supply mechanism 40). As for a substrate (as an example, the substrate W) having a recess (as an example, the recess 101) formed on a front surface thereof and a seed layer (as an example, the seed layer 102) formed on the front surface and an inner surface of the recess, the inhibiting film forming device forms a plating inhibiting film (as an example, the oxide film 103 or the plating inhibiting film 103C) on an upper portion of the recess. The plating liquid supply supplies a plating liquid onto the substrate having the plating inhibiting film formed on the upper portion of the recess. Thus, it is possible to fill the recess with the plating film successfully without adding an additive such as an inhibitor or an accelerator.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to bury the plating film in the recess successfully without adding the inhibitor or the accelerator to the plating liquid.

I claim:

1. A substrate processing method, comprising:
   preparing a substrate which has a recess formed on a front surface thereof and a seed layer formed on the front surface and an inner surface of the recess;
   forming a plating inhibiting film on an upper portion of the recess; and
   forming a plating film in the recess by bringing the substrate into contact with a plating liquid after the forming of the plating inhibiting film, to thereby fill the recess with the plating film,
   wherein the plating inhibiting film is an oxide film.

2. The substrate processing method of claim 1,
   wherein in the forming of the plating inhibiting film, the plating inhibiting film is formed on the upper portion of the recess by obliquely irradiating the front surface of the substrate with light having straightness.

3. The substrate processing method of claim 2,
   wherein in the forming of the plating inhibiting film, the oxide film is formed on the upper portion of the recess by oxidizing the seed layer formed on the upper portion of the recess while generating ozone near the upper portion of the recess by obliquely radiating ultraviolet light to the front surface of the substrate.

4. The substrate processing method of claim 1,
   wherein in the forming of the plating inhibiting film, the oxide film is deposited on the seed layer formed on the upper portion of the recess by allowing ion particles to collide with the film forming material to release atoms of a film forming material obliquely to the front surface of the substrate by a sputtering method.

5. The substrate processing method of claim 1,
   wherein in the forming of the plating inhibiting film, the oxide film is deposited on the seed layer formed on the upper portion of the recess by obliquely irradiating the front surface of the substrate with light or plasma having straightness in an atmosphere supplied with a source gas containing a film forming material through a CVD (Chemical Vapor Deposition) method.

6. The substrate processing method of claim 2,
   wherein in the forming of the plating film, the recess is filled with the plating film by forming the plating film in the recess while dissolving the oxide film with the plating liquid.

7. The substrate processing method of claim 1, further comprising:
   removing, after the forming of the plating film, the upper portion of the recess by mechanical polishing together with the plating inhibiting film.

8. The substrate processing method of claim 1, further comprising:
   removing a natural oxide film formed on the substrate to suppress that a thickness of the oxide film becomes thicker than a required thickness after the preparing of the substrate and before the forming of the plating inhibiting film.

* * * * *